(12) United States Patent
Dickens

(10) Patent No.: US 10,236,163 B1
(45) Date of Patent: Mar. 19, 2019

(54) MICROPLASMA GENERATOR WITH FIELD EMITTING ELECTRODE

(71) Applicant: NXP USA, Inc., Austin, TX (US)

(72) Inventor: Andrew Paul Dickens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/830,141

(22) Filed: Dec. 4, 2017

(51) Int. Cl.
*H01J 37/32* (2006.01)

(52) U.S. Cl.
CPC ..... *H01J 37/3255* (2013.01); *H01J 37/32816* (2013.01)

(58) Field of Classification Search
CPC ........ H01J 17/04; H01J 17/20; H01J 37/3255; H01J 37/32816; H01J 37/32449; H05H 1/54; H05H 1/2406; H05H 2001/2418; H05H 2001/2425; H05H 2001/466
See application file for complete search history.

(56) References Cited

U.S. PATENT DOCUMENTS

| | | | |
|---|---|---|---|
| 4,789,801 A | 12/1988 | Lee | |
| 6,293,090 B1 | 9/2001 | Olson | |
| 6,295,804 B1 | 10/2001 | Burton et al. | |
| 6,334,302 B1 | 1/2002 | Chang Diaz | |
| 6,492,784 B1 | 12/2002 | Serrano | |
| 6,504,308 B1 | 1/2003 | Krichtafovich | |
| 7,395,656 B2 | 7/2008 | Rooney | |
| 7,728,253 B2 * | 6/2010 | Hopwood | G01N 15/0656 156/345.24 |
| 8,210,480 B2 | 7/2012 | Moorer et al. | |
| 8,593,064 B2 | 11/2013 | Chang Diaz | |
| 8,613,188 B2 | 12/2013 | Stein et al. | |
| 9,060,412 B2 | 6/2015 | Leiter et al. | |
| 9,103,329 B2 | 8/2015 | Corbett et al. | |
| 9,330,889 B2 * | 5/2016 | Denning | H01J 7/32247 |
| 9,460,884 B2 * | 10/2016 | Hopwood | H05H 1/2406 |
| 2005/0051420 A1 | 3/2005 | Botvinnik et al. | |
| 2006/0150611 A1 | 7/2006 | Allen | |
| 2007/0046219 A1 | 3/2007 | Krichtafovich et al. | |

(Continued)

FOREIGN PATENT DOCUMENTS

| | | |
|---|---|---|
| CN | 204380854 U | 6/2015 |
| EP | 0903487 A2 | 3/1999 |
| EP | 1681465 B1 | 8/2012 |

OTHER PUBLICATIONS

Arakoni, Ramesh A., et al: "Microdischarges for Use as Microthrusters: Modelling and Scaling", Journal of Physics D: Applied Physics, vol. 41, No. 10, Abstract, Apr. 25, 2008.

(Continued)

*Primary Examiner* — Haissa Philogene

(57) ABSTRACT

Techniques for providing generation of a microplasma around a semiconductor device die or package through the use of an anode-cathode geometry that allows for microplasmas to be created at low voltage. The geometry and cathode materials cause the cathode to emit electrons through field emission. These field emission electrons result in significantly more electrons available for the generation of the microplasma than would be present due to the ambient fluid alone. Thus, the ignition and maintenance of the microplasma occurs at a lower voltage than typical for a fluid at that pressure and the distances involved.

17 Claims, 9 Drawing Sheets

(56) References Cited

U.S. PATENT DOCUMENTS

| | | |
|---|---|---|
| 2007/0089795 A1 | 4/2007 | Jacob |
| 2009/0229240 A1 | 9/2009 | Goodfellow |
| 2010/0127624 A1 | 5/2010 | Roy |
| 2011/0126929 A1 | 6/2011 | Velasquez-Garcia et al. |
| 2012/0304618 A1 | 12/2012 | Roy |
| 2013/0038199 A1 | 2/2013 | Roy et al. |
| 2013/0075382 A1 | 3/2013 | Roy |
| 2014/0202131 A1 | 7/2014 | Boswell |
| 2015/0115798 A1 | 4/2015 | Szatkowski et al. |
| 2015/0123542 A1 | 5/2015 | Sears |
| 2015/0213991 A1* | 7/2015 | Velasquez-Garcia ............ H01J 17/20 315/324 |
| 2016/0007436 A1 | 1/2016 | Roy |
| 2016/0068960 A1 | 3/2016 | Jung et al. |

OTHER PUBLICATIONS

Blajan, Marius, et al: "Emission Spectroscopy of Pulsed Powered Microplasma for Surface Treatment of PEN Film", Industry Applications Society Annual Meeting (IAS), Oct. 3-7, 2010, IEEE, pp. 1-8.

Kothnur, P.S., et al: "Simulation of Direct-Current Microdischerges for Application in Electro-Thermal Class of Small Satellite Propulsion Devices", Contributions to Plasma Physics, vol. 4 7, Issue 1-2, Feb. 2007, Abstract.

Krichtafovith, I.A., et al: "Electrostatic Fluid Accelerator and Air Purifier—The Second Wind", webpage: https://www.ee.washington.edu/researchtseal/pubfiles/Krichtafovitch_ESA_June_05.pdf, pp. 1-13.

Liu, P., et al: "Atmospheric Pressure Microwave-Powered Microplasma Source Based on Strip-Line Structure", Plasma Science (ICOPS), 2013 Abstracts IEEE International Conference, Jun. 16-21, 2013, p. 1.

Liu, Peiyao, et al: "Diagnostics of Atmospheric Pressure Microwave Generated Micro-Plasma by Using Optical Emission Spectroscopy", Plasma Sciences (ICOPS) held with 2014 IEEE International Conference on High-Power Particle Beams (BEAMS), 2014 IEEE. 41st International Conference, May 25-29, 2017, p. 1.

Papadakis, A. P., et al: "Microplasmas: A Review", The Open Applied Physics Journal, 2011, 4, Open Access, pp. 45-63.

U.S. Appl. No. 15/586,868, Inventor Andrew Paul Dickens, "Electrostatic Microthruster", filed May 4, 2017.

U.S. Appl. No. 15/586,868, Inventor Andrew Paul Dickens, "Electrostatic Microthruster", filed May 4, 2017, Office Action—Non Final Rejection, dated Nov. 8, 2017.

Notice of Allowance dated Jul. 17, 2018, U.S. Appl. No. 15/586,868, 14 pages.

* cited by examiner

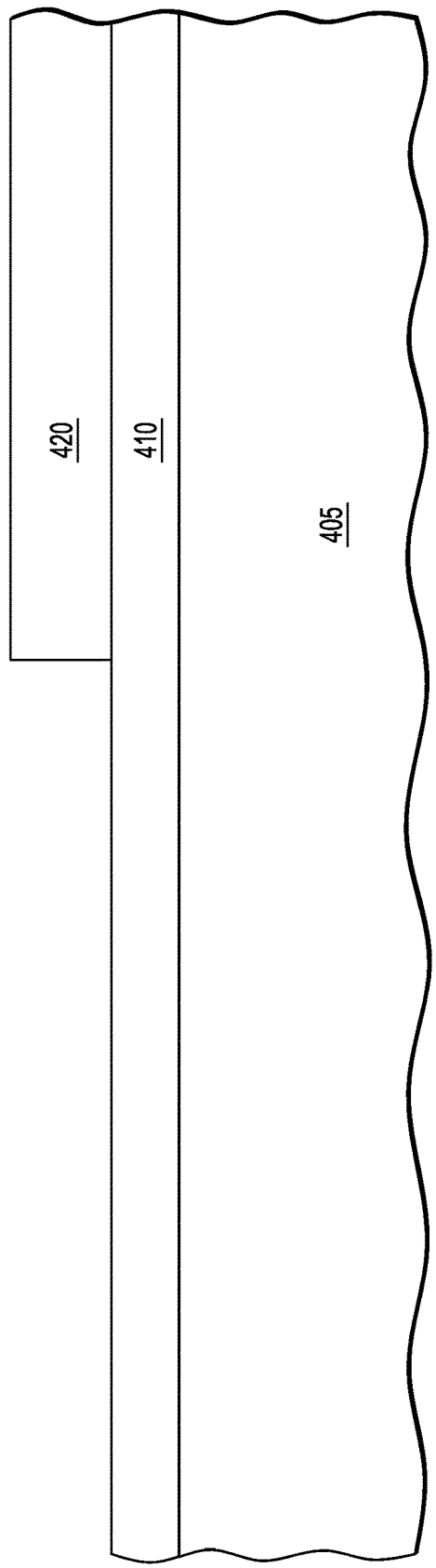
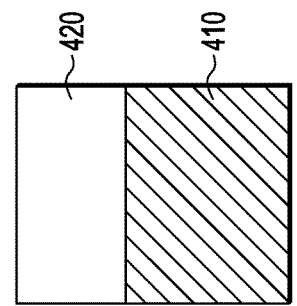
FIG. 5A
FIG. 5B

MICROPLASMA GENERATOR WITH FIELD EMITTING ELECTRODE

BACKGROUND

Field

This disclosure relates generally to semiconductor devices, and more specifically, to a mechanism for generating a low-voltage microplasma using a field-emitting electrode.

Related Art

Directing movement of a fluid across a surface or through an opening can be desirable for a variety of applications. For semiconductor devices, fluid motion (e.g., that of the ambient atmosphere surrounding the device) can be useful for cooling the device or providing the fluid to a sensor used to determine characteristics of the fluid. Typically, moving the fluid is performed by a fan, or another mechanical device, external to the device. But such external devices are typically physically large and require significant power. This makes traditional devices inappropriate for applications that require low power and small form factors.

It is therefore desirable to have a mechanism for directing movement of a fluid over and around a semiconductor device that does so using low power and without a mechanical device. This can be performed, for example, by forming a plasma and then manipulating that plasma with an electric field. Not only are the ionized fluid particles moved by this manipulation, but the non-ionized particles in contact or near contact with the ionized fluid particles are moved as well (e.g., boundary layer flow).

For many semiconductor device applications, power consumption can be a significant concern. Thus, if a plasma is generated for a semiconductor device application, it is desirable to have plasma ignition and maintenance at a low power for the scale of the application.

BRIEF DESCRIPTION OF THE DRAWINGS

The present invention may be better understood, and its numerous objects, features, and advantages made apparent to those skilled in the art by referencing the accompanying drawings.

FIG. 5A is a simplified block diagram illustrating a cross section of semiconductor device at a stage in formation following that illustrated in FIG. 4, in accord with embodiments of the present invention. FIG. 5B is a plan view of semiconductor device at the same stage in formation.

DETAILED DESCRIPTION

Embodiments of the present invention provide for generation of a microplasma around a semiconductor device die or package through the use of an anode-cathode geometry that allows for microplasmas to be created at low voltage. The geometry and cathode materials cause the cathode to emit electrons through field emission. These field emission electrons result in significantly more electrons available for the generation of the microplasma than would be present due to the ambient fluid alone. Thus, the ignition and maintenance of the microplasma occurs at a lower voltage than expected for a fluid at that pressure and the distances involved.

Plasmas can be used for a variety of applications, for example, materials processing, materials analysis, cleaning surfaces, propulsion, and on-chip cooling. For microchip-level applications, such as on-chip cooling or materials analysis, microplasma generation and manipulation can replace mechanical cooling systems. Microplasmas are plasmas that have a very small volume, typically on the order of microns. The geometry of the plasma can be altered through use of an electric field generated around the plasma. By moving the plasma, both the ionized molecules in the plasma and non-ionized molecules in the surrounding ambient gas can be moved in a desired direction. Such movement can be used to cool a surface of a semiconductor device, or could be used to direct the ambient gas molecules to a sensor.

A plasma is typically generated by subjecting a gas to a strong electric field. The field increases the number of electrons in the volume of gas, thereby creating ionized particles, and potentially dissociation of molecular bonds. The significant presence of charge carriers makes a plasma electrically conductive, so it responds strongly to electromagnetic fields. Unlike a non-ionized gas, a plasma can be manipulated to change shape or be moved in response to the electromagnetic field.

Breakdown voltage, VB, is the voltage needed to start a plasma discharge between two electrodes in a gas. Electrons are provided to the gas from one of the electrodes (the cathode) and accelerated toward the other electrode (the anode). An electron provided by the cathode can collide with an electron of one of the gas molecules or atoms (e.g., colliding with an electron of a nitrogen molecule). If a gas molecule electron is dislodged due to the collision, the free electron will be accelerated toward the anode and may impact with an electron of another gas molecule. A series of collisions can lead to an avalanche breakdown resulting in an arc from the cathode to the anode and generation of a plasma.

Figure 1:
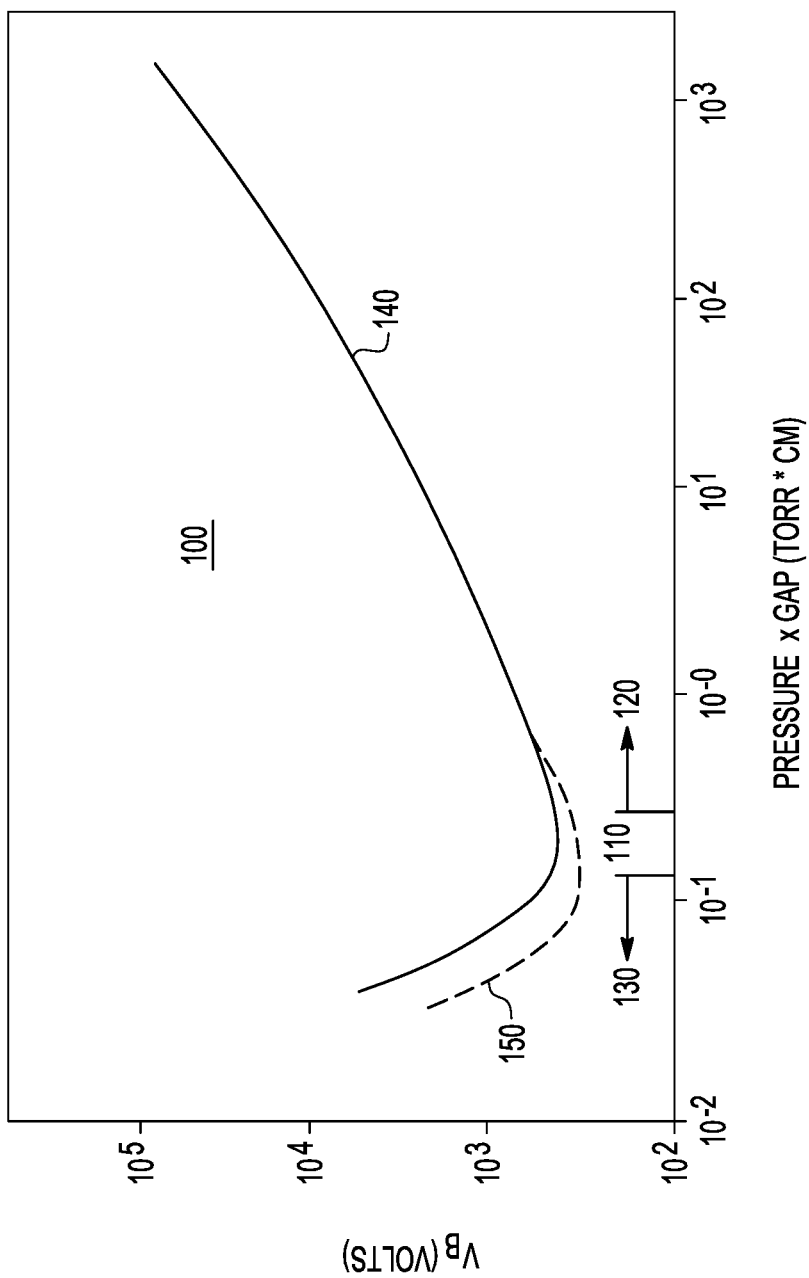
FIG. 1 illustrates an example of a Paschen's Law relationship between VB and the gas pressure (p) multiplied by the distance (d) between the two electrodes (e.g., Torr×cm).

Paschen's Law is an equation that empirically describes the relationship between a variety of physical parameters necessary to start and sustain a plasma. An example of the Paschen's Law relationship between VB and the gas pressure (p) multiplied by the distance (d) between the two electrodes (e.g., Torr×cm) is illustrated in FIG. 1. The solid line curve 140 in FIG. 1 illustrates the Paschen's Law curve for air. As can be seen, the breakdown voltage required to initiate a plasma has a minimum value in the (pd) range illustrated at 110. As (pd) increases from the values in 110 (i.e., in the range illustrated at 120), the breakdown voltage increases. This is due to an increase in a number of gas molecules between the electrodes, from either an increased distance between the electrodes or a higher pressure providing an increased number of gas molecules. The increased number of molecules between the electrodes makes it more difficult to cause the avalanche breakdown that results in the plasma. Thus, the voltage needed to cause the plasma increases, as illustrated.

In addition, as (pd) decreases below the values in 110 (i.e., in the range illustrated at 130), the breakdown voltage also increases. This is due to there being fewer gas molecules between the electrodes, either due to a decreased distance between the electrodes or due to a decrease in pressure of the gas. In this case, the availability of molecules to interact with the electrons emitted from the cathode is lower, leading to fewer ionizing collisions. Therefore, a greater voltage is needed to assure ionization of enough gas molecules to start an avalanche.

For semiconductor applications, in which operating at low power can be important, and in which distances are very small, mechanisms for generating a microplasma can fall within or near (pd) range 130 of FIG. 1. Techniques for optimally generating such a microplasma and manipulating that microplasma to a desired action are desirable. Embodiments of the present invention provide a mechanism for generation of such a microplasma.

Figure 2:
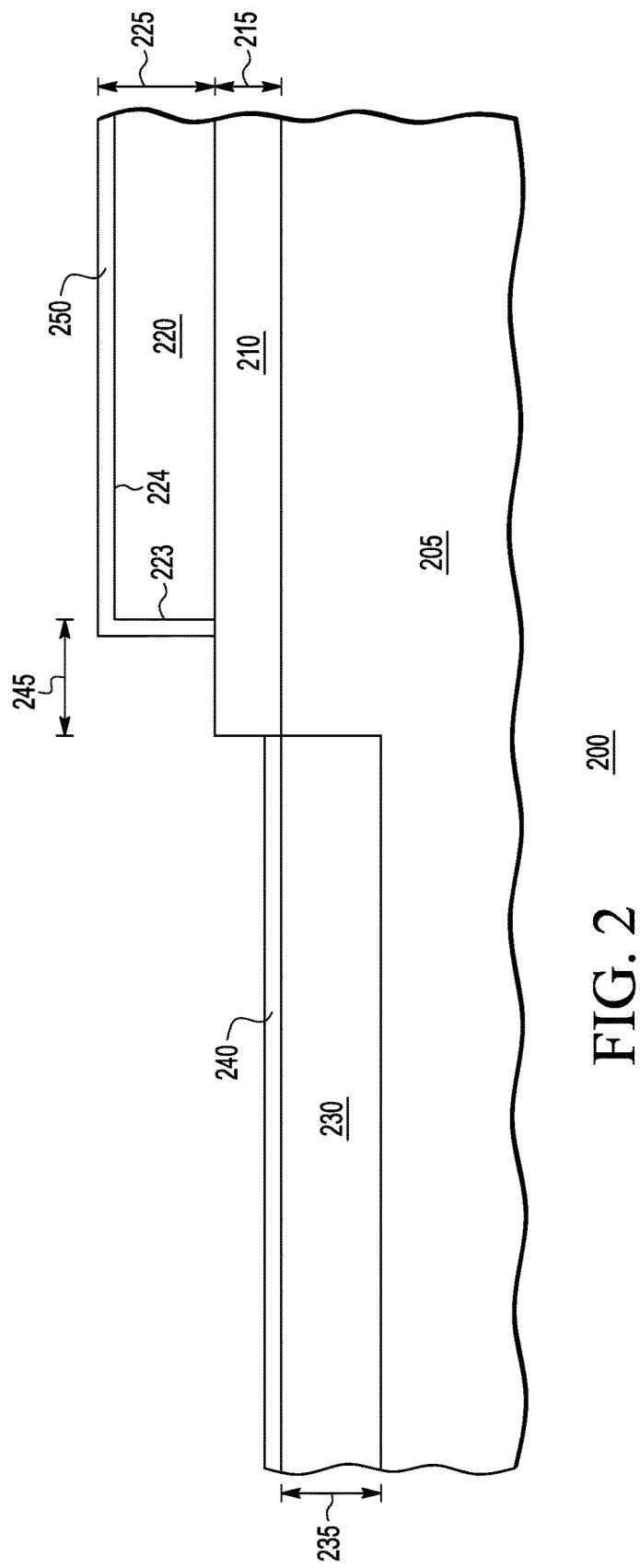
FIG. 2 is a simplified block diagram illustrating a cross-section of an electrode configuration on a semiconductor device for generating a microplasma, according to one embodiment of the present invention.

FIG. 2 is a simplified block diagram illustrating a cross-section of an electrode configuration on a semiconductor device for generating a microplasma, according to one embodiment of the present invention. Semiconductor device 200 is formed on a substrate 205. Substrate 205 can be any semiconductor material or combinations of materials, such as gallium arsenide, silicon germanium, silicon-on-insulator, silicon, monocrystalline silicon, the like, and combinations of the above. In one embodiment of the present invention, substrate 205 is a p-type silicon substrate.

A dielectric layer 210 is formed on substrate 205. In general, dielectric layer 210 can include silicon dioxide, silicon nitride, silicon oxynitride, or any combination of such layers. Dielectric layer 210 may be thermally grown on substrate 205 or deposited. In one embodiment, dielectric layer 210 can have a thickness 215 of about 0.1 µm.

A first generation electrode 220 is formed over dielectric layer 210. In one embodiment, the first layer can be an n-doped polysilicon layer deposited or grown on dielectric layer 210. In one embodiment, the first generation electrode 220 layer has a thickness 225 of between about 0.1 µm to about 0.25 µm.

As will be discussed in further detail below, the first generation electrode 220 is offset horizontally from an edge of dielectric layer 210 by a horizontal space 245. In embodiments, horizontal space 245 is between about 0.1 µm to about 0.25 µm. This allows both side 223 and major surface 224 to be involved in generation of a plasma by semiconductor device 200.

A second generation electrode region 230 is formed in substrate 205. Second generation electrode region 230 can be formed using a doping implant process (e.g., an n-type doping in the p-type substrate). Embodiments of the present invention can provide a thickness 235 for the second generation electrode region 230 of between about 0.1 µm to about 0.25 µm.

The first and second generation electrodes will be used to generate a microplasma in an ambient fluid above the surface of the device. But, as discussed above, due to the small dimensions between the generation electrodes, the device geometry may be in the (pd) range of 130 in FIG. 1 (e.g., distance 245 at the ambient fluid pressure), thus there will be fewer fluid molecules to interact with electrons generated by an electric field between the generation electrodes. This requires a higher ignition voltage for the plasma than the Paschen Curve minimum. In order to compensate for this, embodiments of the present invention provide a low work function material formed in layers 240 and 250 on the surfaces of the first and second generation electrodes. The low work function material provides additional electrons in the region between the generation electrodes through a field emission process. By having additional electrons to interact with the fluid molecules between the cathode and anode, a microplasma may be initiated between the first and second generation electrodes at a lower voltage than indicated by the Paschen curve. This effectively shifts the Paschen curve down, to allow for a lower breakdown voltage than expected for a gas at that pressure. This is illustrated by the dashed line curve 150 in FIG.

Figure 3:
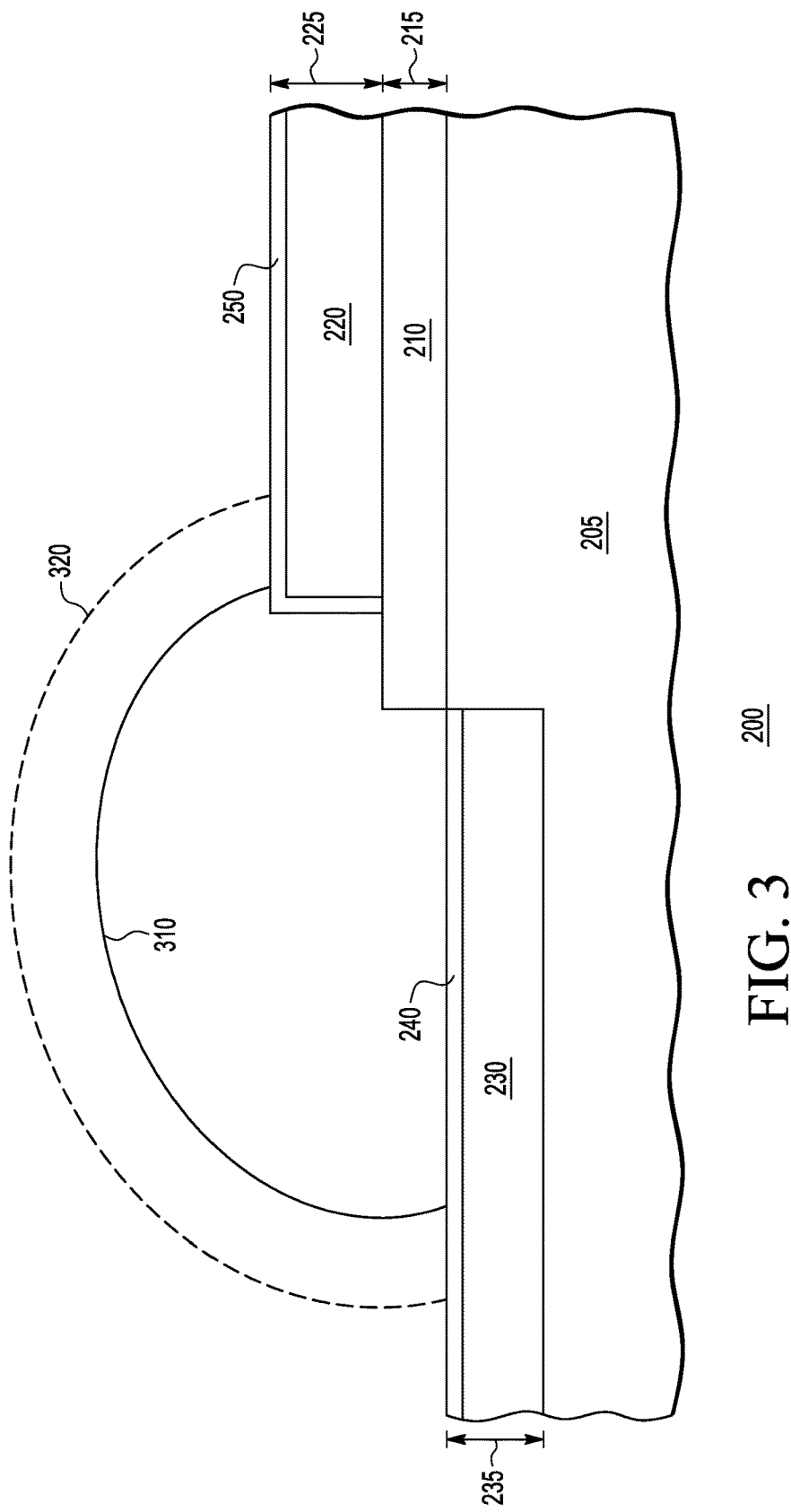
FIG. 3 is a simplified block diagram illustrating a cross-sectional example of formation of a plasma between the generation electrodes, in accord with one embodiment of the present invention.

FIG. 3 is a simplified block diagram illustrating a cross-sectional example of formation of a plasma between the generation electrodes, in accord with one embodiment of the present invention. During operation, first and second generation electrodes 220 and 230 will form a high electric field region that will create an area of plasma generation. A plasma 310 is generated between generation electrodes 220 and 230, with generation electrode 220 being the cathode and generation electrode 230 being the anode. In this example, the ambient gas is air and the dominant ion in the plasma is thus nitrogen ($N_{4+}$). Dashed line 320 shows an outer boundary of the plasma where the ionized gas particles can interact with non-ionized gas particles.

Potential applications of embodiments of the invention include, for example, ionic wind generators, ionic propulsion, ion generation for mass spectrometry or field asymmetric ion mass spectroscopy, plasma generation for displays, and plasma generation for lab-on-a-chip type analysis. A small, low-voltage plasma source, such as that illustrated, may find use in the above systems and displace elements that require higher voltages or larger surface areas.

FIGS. 4-8B illustrate an example method for forming a device to generate a microplasma in accord with embodiments of the present invention.

Figure 4:
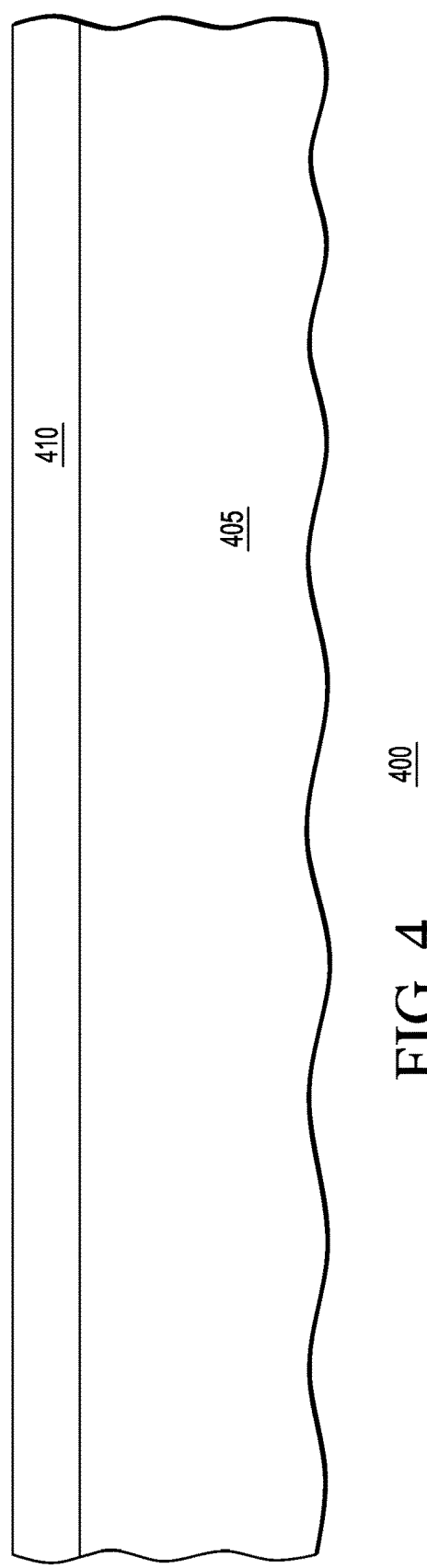
FIG. 4 is a simplified block diagram illustrating a cross section of a semiconductor device at a first step in formation, in accord with embodiments of the present invention.

FIG. 4 is a simplified block diagram illustrating a cross section of a semiconductor device 400 at a first step in formation, in accord with embodiments of the present invention. FIG. 4 provides a semiconductor substrate 405. As stated above, the semiconductor substrate can be a p-type semiconductor wafer. After a cleaning of a major surface of the substrate, a dielectric layer 410 is formed. In one embodiment, dielectric layer 410 is silicon dioxide and is formed to a thickness of about 0.01 to 0.1 µm through deposition.

FIG. 5A is a simplified block diagram illustrating a cross section of semiconductor device 400 at a next stage in formation following that illustrated in FIG. 4, in accord with embodiments of the present invention. FIG. 5B is a plan view of semiconductor device 400 at the same stage in formation. A cathode layer 420 is formed on oxide layer 410. Cathode layer 420 is formed from a conductive material, such as but not limited to doped amorphous silicon, doped polysilicon, aluminum, copper, tantalum, titanium, tungsten, or any metal alloy, nitride or silicide thereof or any material to be made conductive by subsequent implantations of dopants, such as undoped polysilicon, for example. In one embodiment, cathode layer 420 is deposited polysilicon that is n-doped. Cathode layer 420 (and other conductive layers) can be grown or deposited using a conventional or proprietary technique, such as CVD technique, PVD technique, the like, or any combination thereof. Cathode layer 420 is then shaped using photolithography and subsequent etching techniques known in the art. FIG. 5B illustrates the relative locations of layers 410 and 420 after etching.

Figure 6A:
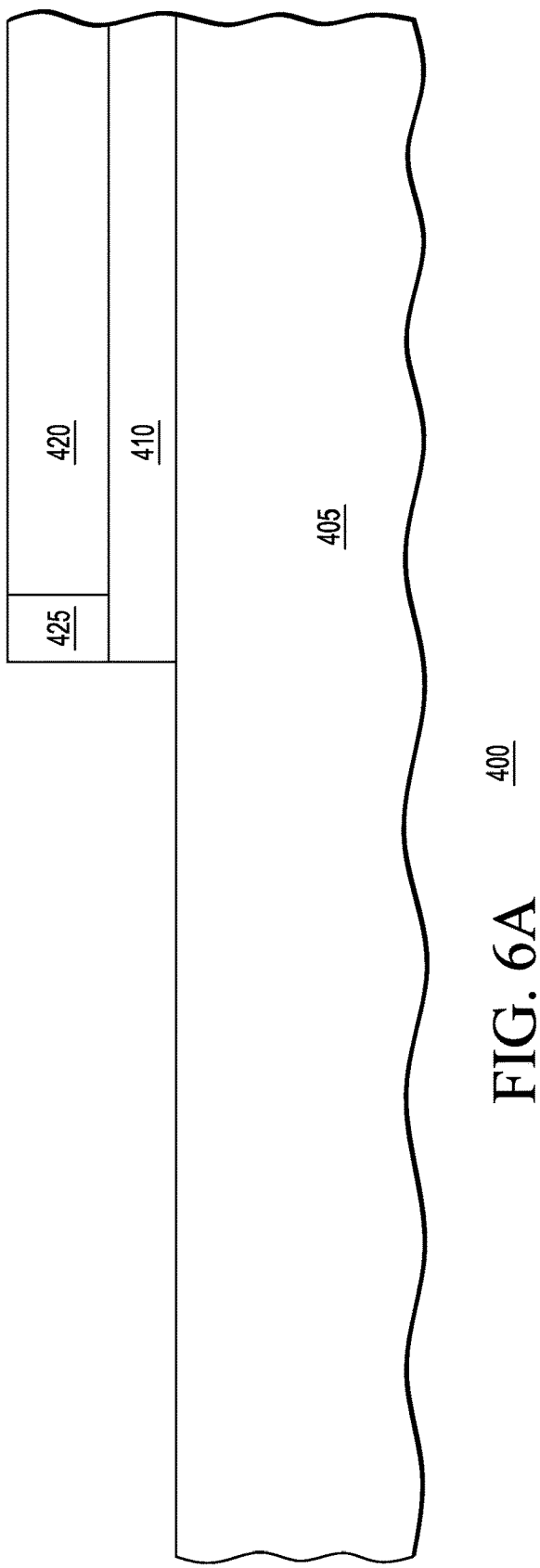
FIG. 6A is a simplified block diagram illustrating a cross section of semiconductor device at a stage in formation following that illustrated in FIGS. 5A and 5B, in accord with embodiments of the present invention.
Figure 6B:
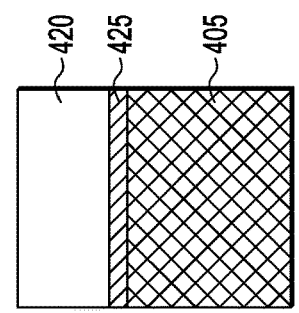
FIG. 6B is a plan view of semiconductor device at the same stage in formation.

FIG. 6A is a simplified block diagram illustrating a cross section of semiconductor device 400 at a next stage in formation following that illustrated in FIGS. 5A and 5B, in accord with embodiments of the present invention. FIG. 6B is a plan view of semiconductor device 400 at the same stage in formation. At this stage, a spacer 425 is formed along the edge of cathode layer 420. Spacer material is deposited on the surface of the device, and then is shaped using photolithography and subsequent etching techniques known in the art. Once the spacer is formed, another etch is performed to remove oxide layer 410 from regions not protected by cathode layer 420 and spacer 425, exposing substrate 405. FIG. 6B illustrates the relative locations of layers 405, 420, and 425 after etching.

Figure 7A:
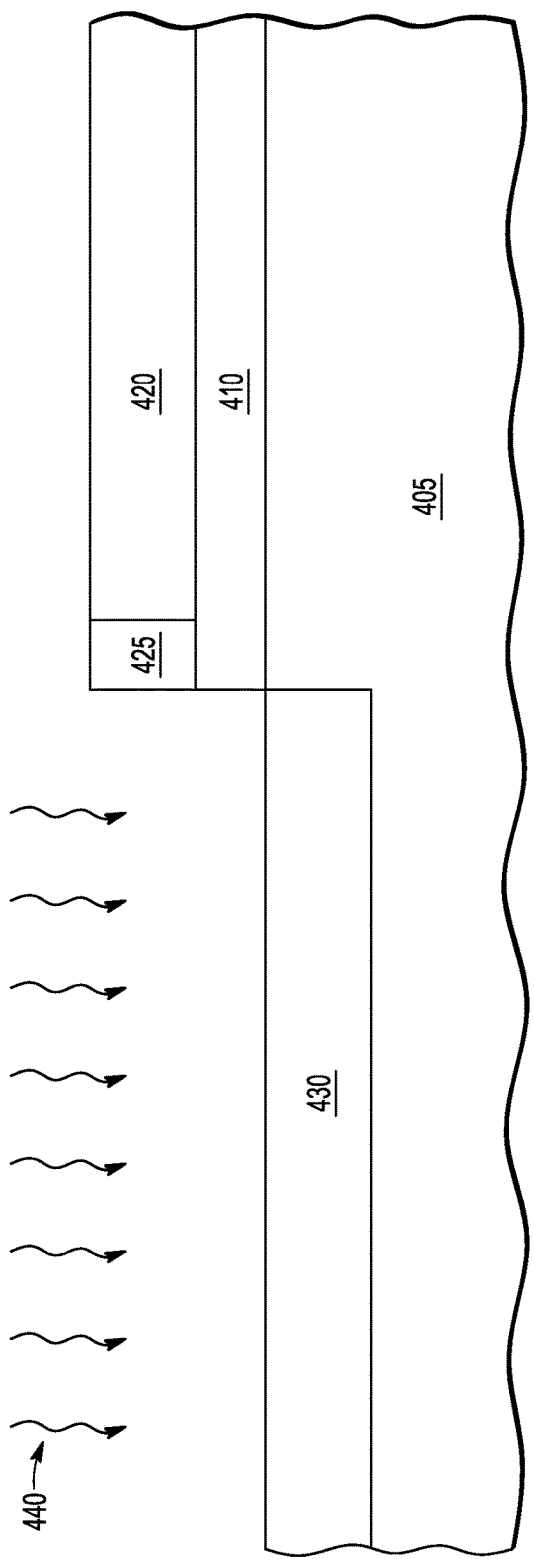
FIG. 7A is a simplified block diagram illustrating a cross section of semiconductor device at a stage in formation following that illustrated in FIGS. 6A and 6B, in accord with embodiments of the present invention.
Figure 7B:
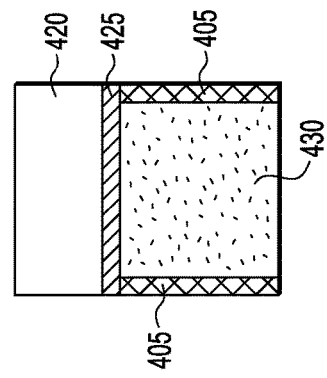
FIG. 7B is a plan view of semiconductor device at the same stage in formation.

FIG. 7A is a simplified block diagram illustrating a cross section of semiconductor device 400 at a next stage in formation following that illustrated in FIGS. 6A and 6B, in accord with embodiments of the present invention. FIG. 7B is a plan view of semiconductor device 400 at the same stage in formation. At this stage, an implant is performed to a region of exposed substrate 405 to form a conductive n-well region 430. Conductive n-well region 430 will be a portion of the anode for the semiconductor device. An anneal can also be performed subsequent to the implantation. FIG. 7B illustrates the relative locations of layers 405, 420, 425, and conductive n-well region 430 after the n-well implantation.

Figure 8A:
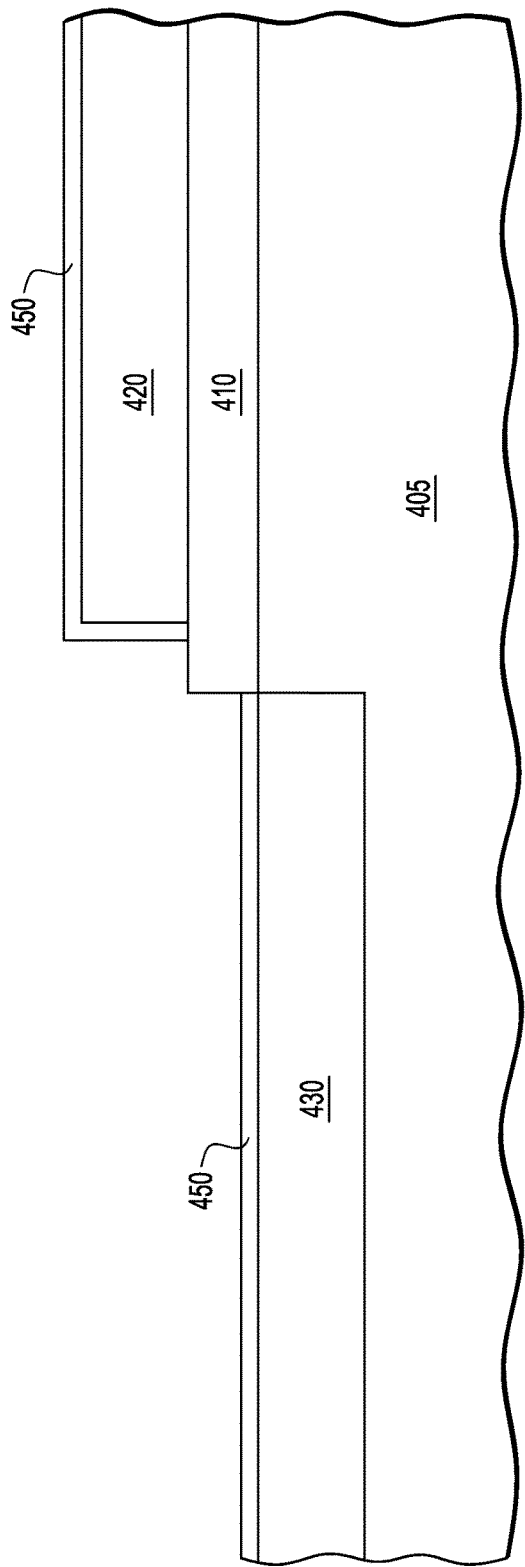
FIG. 8A is a simplified block diagram illustrating a cross section of semiconductor device at a stage in formation following that illustrated in FIGS. 7A and 7B, in accord with embodiments of the present invention.
Figure 8B:
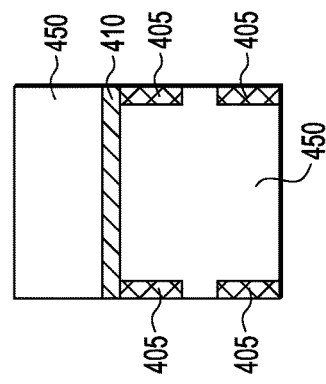
FIG. 8B is a plan view of semiconductor device at the same stage in formation.

FIG. 8A is a simplified block diagram illustrating a cross section of semiconductor device 400 at a next stage in formation following that illustrated in FIGS. 7A and 7B, in accord with embodiments of the present invention. FIG. 8B is a plan view of semiconductor device 400 at the same stage in formation. A thin metal layer 450 is formed on the surfaces of cathode layer 420 and conductive n-well region 430, forming the cathode and anode surfaces of the device. As discussed above, thin metal layer 450 is a low work function metal that can contribute free electrons to the region between the cathode and anode, thereby enhancing ignition and maintenance of a plasma in that region. In one embodiment, thin metal layer 450 is tungsten. In one embodiment, thin metal layer 450 is formed using a salicide process known in the art, in which a thin layer of tungsten is deposited on the device, and then the tungsten is annealed though heating. Subsequent to the annealing, any excess tungsten not on silicon is removed through a stripping process. FIG. 8B illustrates the relative locations of layers 405, 410, and 450 after the formation of thin metal layer 450.

In one embodiment of the present invention, contribution of free electrons to the region between the cathode and anode can be further enhanced by roughening the surface of thin metal later 450. The surface roughening, coupled with sharp edges of one or both electrodes, enhances the number of free electrons by virtue of providing additional surface area from which the electrons can be emitted. The surface roughening can be provided through modification of the salicide process, as known in the art. Surface roughening can also be performed through acid treatments, etching, and other processes known in the art.

In one application of embodiments of the present invention, a plasma can get generated by a semiconductor device such as semiconductor device 200 or 400 (e.g., as illustrated in FIG. 3). The resulting plasma can then be manipulated using two or more drive electrodes that generate an electric field between them.

Figure 9:
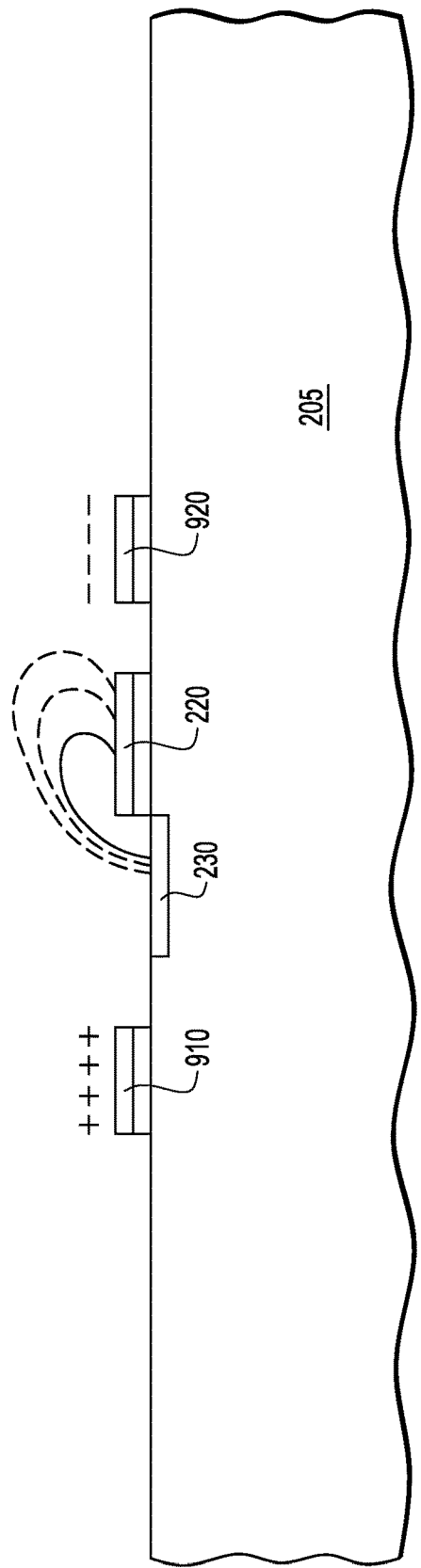
FIG. 9 is a simplified block diagram illustrating a cross-sectional example of a plasma generated between the generation electrodes under the influence of an electric field generated by the drive electrodes, in accord with one embodiment of the present invention.

FIG. 9 is a simplified block diagram illustrating a cross-sectional example of a plasma generated between the generation electrodes under the influence of an electric field generated by the drive electrodes, in accord with one embodiment of the present invention. Plasma 910 has a modified shape from that of FIG. 3 due to being attracted by a negative charge in drive electrode 920 and repelled by a positive charge in drive electrode 910. The nitrogen ions in the plasma (as generated in an ambient fluid of air) then accumulate around drive electrode 920. The attraction of the nitrogen ions to drive electrode 920 can occur within 10 nanoseconds of applying the charge to the drive electrodes. This can result in a movement of not only the ionized gas molecules but also the neutral gas molecules in contact with the plasma, as illustrated by the dashed lines in the boundary region of the plasma.

As discussed above, one embodiment of the present invention provides a microplasma generator that includes a substrate having a substrate surface, a first generation electrode located on the substrate surface, a first dielectric layer located on the substrate surface and laterally adjacent to the first generation electrode, a second generation electrode located on the first dielectric layer and a first offset distance from a boundary between the first dielectric layer and the first generation electrode, and a low-work function metal located on a surface of the first generation electrode and surfaces of the second generation electrode. The distance between a surface of the first generation electrode and a surface of the second generation electrode is such that a plasma can be formed in an ambient gas at a predetermined voltage difference between the first generation electrode and the second generation electrode. The ambient gas is in contact with the first and second generation electrodes at a first pressure.

In one aspect of the above embodiment, the first offset distance is such that the distance multiplied by the first pressure is below a minimum of a Paschen curve for the ambient gas at the first pressure for the predetermined voltage. In another aspect of the above embodiment, the first offset distance is between about 0.1 to 0.25 microns. In a further aspect, the ambient gas is air at one atmosphere pressure. In another aspect of the above embodiment, the low-work function metal has a roughened surface that enhances field emission characteristics of the low-function metal.

Another embodiment of the present invention provides a method for forming a microplasma generator. The method includes forming a dielectric layer on a major surface of a semiconductor substrate, forming a first conductive layer on a portion of the dielectric layer, forming a spacer material on a portion of the dielectric layer along an edge of the first conductive layer, etching the dielectric layer from the substrate in the areas not covered by the first conductive layer and the spacer material, forming a second conductive layer in the substrate along the edge of the spacer material, and forming a thin metal layer on the exposed surfaces of the first a second conductive layers. The spacer material extends about 0.1 to about 0.25 microns from the edge of the first conductive layer. The thin metal layer includes a low work function metal.

One aspect of the above embodiment further includes forming the dielectric layer to a thickness between 0.01 to 0.1 micron, where the dielectric layer includes silicon dioxide. Another aspect of the above embodiment further includes forming the first conductive layer to a thickness of between about 0.1 to 0.25 microns, where the first conductive layer includes n-doped polysilicon.

Another aspect of the above embodiment further includes removing the spacer material subsequent to the forming of the second conductive layer in the substrate and prior to the forming of the thin metal layer. A further aspect provides that the forming of the thin metal layer on the exposed surfaces of the first conductive layer results in a thin metal layer on a major surface of the first conductive layer that is parallel to the major surface of the substrate and on a minor surface of the first conductive layer that is perpendicular to the major surface of the substrate. In a still further aspect a surface of the thin metal layer on the minor surface of the first conductive layer is between about 0.1 to 0.25 microns from an edge of the thin metal layer on the surface of the second conductive layer.

Another aspect of the above embodiment provides that forming the thin metal layer further includes forming the thin metal layer using a salicide process. In a further aspect, the forming of the thin metal layer includes forming the thin metal layer to have a roughened surface, where the roughened surface is configured to enhance a field emission from the conductive layer functioning as a cathode during operation of the microplasma generator. In another aspect of the above embodiment, the low work function metal is tungsten.

Another embodiment of the present invention provides a method that includes: providing a first generation electrode on a substrate surface, providing a second generation electrode formed on a first dielectric layer located on the substrate surface and laterally offset from the first generation electrode, providing an ambient gas at a first pressure in contact with the substrate surface and the first and second generation electrodes, applying a predetermined voltage difference between the first and second generation electrodes, forming a plasma in the ambient gas between the first and second generation electrodes. The first and second generation electrodes are coated with a low work function metal. The offset distance between edges of the first and second generation electrodes is such that the offset distance multiplied by the first pressure is at or below a minimum of a Paschen curve for the ambient gas at the first pressure for the predetermined voltage.

In one aspect of the above embodiment the offset distance between edges of the first and second generation electrodes is between about 0.1 to 0.25 microns. In a further aspect, the ambient gas includes air at one atmosphere.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A microplasma generator comprising:
   a substrate comprising a substrate surface;
   a second generation electrode located on the substrate surface;
   a first dielectric layer located on the substrate surface and laterally adjacent to the first generation electrode;
   a first generation electrode located on the first dielectric layer and a first offset distance from a boundary between the first dielectric layer and the first generation electrode;
   a low-work function metal located on a surface of the first generation electrode and a surface of the second generation electrode, wherein
      a distance between the surface of the first generation electrode and the surface of the second generation electrode is such that a plasma is formed in an ambient gas at a predetermined voltage difference between the first generation electrode and the second generation electrode, and
      the ambient gas is in contact with the first and second generation electrodes at a first pressure.

2. The microplasma generator of claim 1 wherein the first offset distance is such that the distance multiplied by the first pressure is below a minimum of a Paschen curve for the ambient gas at the first pressure for the predetermined voltage difference.

3. The microplasma generator of claim 1 wherein the first offset distance is between about 0.1 to 0.25 microns.

4. The microplasma generator of claim 3 wherein the ambient gas comprises air at one atmosphere pressure.

5. The microplasma generator of claim 1 wherein the low-work function metal has a roughened surface that enhances field emission characteristics of the low-function metal.

6. A method for forming a microplasma generator, the method comprising:
  forming a dielectric layer on a major surface of a semiconductor substrate;
  forming a first conductive layer on a portion of the dielectric layer;
  forming a spacer material on a portion of the dielectric layer along an edge of the first conductive layer, wherein the spacer material extends about 0.1 to about 0.25 microns from the edge of the first conductive layer;
  etching the dielectric layer from the substrate in areas not covered by the first conductive layer and the spacer material;
  forming a second conductive layer in the substrate along an edge of the spacer material;
  forming a thin metal layer on exposed surfaces of the first and second conductive layers, wherein the thin metal layer comprises a low work function metal.

7. The method of claim 6 further comprising:
  forming the dielectric layer to a thickness between about 0.01 to 0.1 micron, wherein the dielectric layer comprises silicon dioxide.

8. The method of claim 6 further comprising:
  forming the first conductive layer to a thickness of between about 0.1 to 0.25 microns, wherein the first conductive layer comprises n-doped polysilicon.

9. The method of claim 6 further comprising removing the spacer material subsequent to said forming the second conductive layer in the substrate and prior to said forming the thin metal layer.

10. The method of claim 9 wherein said forming the thin metal layer on the exposed surface of the first conductive layer results in a thin metal layer on a major surface of the first conductive layer that is parallel to the major surface of the substrate and on a minor surface of the first conductive layer that is perpendicular to the major surface of the substrate.

11. The method of claim 10 wherein a surface of the thin metal layer on the minor surface of the first conductive layer is between about 0.1 to 0.25 microns from an edge of the thin metal layer on the surface of the second conductive layer.

12. The method of claim 6 wherein said forming the thin metal layer further comprises:
  forming the thin metal layer using a salicide process.

13. The method of claim 12 wherein said forming the thin metal layer using a salicide process further comprises forming the thin metal layer to have a roughened surface, wherein the roughened surface is configured to enhance a field emission from the first conductive layer functioning as a cathode during operation of the microplasma generator.

14. The method of claim 6 wherein the low work function metal is tungsten.

15. A method for generating a microplasma, the method comprising:
  providing a second generation electrode on a substrate surface;
  providing a first generation electrode formed on a first dielectric layer located on the substrate surface and laterally offset from the first generation electrode, wherein the first and second generation electrodes are coated with a low work function metal;
  providing an ambient gas at a first pressure in contact with the substrate surface and the first and second generation electrodes;
  applying a predetermined voltage difference between the first generation electrode and the second generation electrode;
  forming a plasma in the ambient gas between the first generation electrode and the second generation electrode, wherein an offset distance between edges of the first and second generation electrodes is such that the offset distance multiplied by the first pressure is at or below a minimum of a Paschen curve for the ambient gas at the first pressure for the predetermined voltage difference.

16. The method of claim 15 wherein the offset distance between edges of the first and second generation electrodes is between about 0.1 to 0.25 microns.

17. The method of claim 16 wherein the ambient gas comprises air at one atmosphere pressure.

* * * * *